United States Patent
Petillon

(10) Patent No.: US 6,347,286 B1
(45) Date of Patent: Feb. 12, 2002

(54) METHOD AND DEVICE OPERATING BY INTERPOLATION IN A DISCRETE SPECTRUM TO DETERMINE CHARACTERISTICS OF A SIGNAL AND APPLICATION THEREOF

(75) Inventor: Jean-Paul Petillon, Vitrolles (FR)

(73) Assignee: Eurocopter, Marignane Cedex (FR)

(*) Notice: Subject to any disclaimer, the term of this patent is extended or adjusted under 35 U.S.C. 154(b) by 0 days.

(21) Appl. No.: 09/116,800

(22) Filed: Jul. 16, 1998

(30) Foreign Application Priority Data

Jul. 22, 1997 (FR) .............................. 97 09253

(51) Int. Cl.[7] ........................ G01R 23/16; G01R 23/00; G06F 19/00
(52) U.S. Cl. ............................. 702/77; 702/75; 342/120
(58) Field of Search ................ 702/75–77, 189, 702/198; 324/76, 24, 76.19, 76.21; 708/403–405; 342/120, 122, 128, 196

(56) References Cited

U.S. PATENT DOCUMENTS

| | | | |
|---|---|---|---|
| 2,391,411 A | * 12/1945 | Gobel et al. | 342/120 |
| 3,876,946 A | * 4/1975 | La Clair et al. | 702/77 |
| 4,568,938 A | * 2/1986 | Ubriaco | 342/87 |
| 4,717,951 A | * 1/1988 | Fling | 348/566 |
| 4,730,257 A | * 3/1988 | Szeto | 702/77 |
| 4,901,244 A | 2/1990 | Szeto | 702/77 |
| 5,519,402 A | 5/1996 | Kitayoshi | 342/196 |
| 5,576,978 A | 11/1996 | Kitayoshi | 702/77 |
| 5,598,441 A | 1/1997 | Kroeger et al. | 375/344 |

FOREIGN PATENT DOCUMENTS

GB 0 399 704 11/1990

OTHER PUBLICATIONS

Noro et al. Accurate Frequency Estimation from Five Samples. Oct. 1992. Digital Signal Processing. pp 242–246.*
French Search Report dated Apr. 8, 1998, 3 pages.
Offelli et al., "Interpolation Techniques for Real–Time Multifrequency Waveform Analysis", vol. 39, No. 1, pp. 106–111, IEEE Transactions on Instrumentation and Measurement dated Feb. 1990.
Yuichi et al., "Accurate Frequency Estimation from Five Samples", vol. 2, No. 4, pp. 242–246, Digital Signal Processing, dated Oct. 1992.

* cited by examiner

Primary Examiner—Marc S. Hoff
Assistant Examiner—Manuel L. Barbee
(74) Attorney, Agent, or Firm—Marshall, Gerstein, & Borun

(57) ABSTRACT

The present invention concerns a method and a device (1) operating by intepolation in a discrete spectrum to determine characteristics Pq of a signal s(t,Pq). In accordance with the invention, said device (1) includes means (2, 4, 6, 8, 10, 12) for determining said characteristics Pq from a system of m equations:

$z(fi)=Fi[w(t).s(t,Pq)].h(f)$, i varying from 1 through m and m being greater than or equal to 2, wherein:
  z(fi) is an element of a discrete spectrum obtained by Fourier transformation of the signal s(t,Pq),
  Fi is a discrete Fourier transform,
  w(t) is a temporal weighting function, and
  h(f) is a frequency transfer function of an anti-aliasing filter.

28 Claims, 2 Drawing Sheets

METHOD AND DEVICE OPERATING BY INTERPOLATION IN A DISCRETE SPECTRUM TO DETERMINE CHARACTERISTICS OF A SIGNAL AND APPLICATION THEREOF

BACKGROUND OF THE INVENTION

The present invention concerns a method and a device operating by interpolation in a discrete spectrum to determine particular characteristics of a signal, such as the frequency, the amplitude or the phase, and applications of said method.

It is known that various characteristics can be determined from a processed temporal signal, in particular according to the intended applications and uses.

One of the characteristics most often used and extracted from a processed temporal signal is its frequency. This is the case in particular:

when the frequency corresponds to a physical magnitude to be evaluated, for example the beat frequency of a radioaltimeter which is proportional to the altitude to be measured or the beat frequency of Doppler effect radar which is proportional to the projection of the speed of the mobile onto the axis of the beam, or when the signal is a modulated carrier and the frequency of the carrier is needed to demodulate the signal (for example in radiocommunication or "GPS" receivers).

Determining the frequency of a signal, which seems easy in theory, for example by using a frequency meter counting cycles, is often subject to major difficulties in practice, however, in particular because of interference to which the signal is subject. It is known that a temporal signal of the above kind is often subject to very high levels of interference, in particular caused by:

noise, in particular the intrinsic noise of a transmit and receive system used, and/or spurious signals, for example echoes from objects other than the ground in the case of a radioaltimeter, and/or other signals, for example sidebands of a modulated carrier.

To solve these interference problems at least in part, the signal is often subjected to discrete Fourier transformation to obtain a discrete spectrum which simplifies determination of the frequency.

In many systems the signal is sampled and digitized, and this often applies at the beat signal stage, and all subsequent processing is performed in the digital domain, usually by means of dedicated processors.

The following devices that can use digital processing may be cited as examples: radioaltimeters, "GPS" receivers, radiocommunication receivers, in particular those using satellites, and Doppler effect radar (onboard velocity measurement or surveillance radar).

In the manner known in itself, measuring the frequency of the signal then consists in identifying in the spectrum obtained by the Fourier transformation of the signal the rank of the component with the greatest amplitude. This rank corresponds directly to a frequency.

However, because of the discrete nature of the spectrum, the measurement resolution is limited to the value of the frequency increment used.

Moreover, the amplitude measured in the spectrum is falsified if the frequency of the signal is not an integer multiple of the frequency increment.

In the manner known in itself, to improve resolution:

either the sampling frequency is reduced, which reduces the analysis range in the same proportions, however, or the size of the Fourier transform is increased, which significantly increases the computation load, however.

The present invention concerns a solution based on a particular frequency domain interpolation of the discrete spectrum which has the particular object of improving the resolution of the estimation of the frequency of the signal without reducing the sampling frequency and/or increasing the size of the Fourier transform.

There are various prior art solutions to the problem of frequency domain interpolation processing of a discrete spectrum.

They include:

interpolation on three adjacent samples around a local maximum, with a quadratic interpolation function (document U.S. Pat. No. 5,598,441) or a Gaussian interpolation function (document EP-0 399 704), or interpolation on the two samples adjacent a local maximum, with the interpolation function being an approximation of the Fourier transform of the Hamming window (document U.S. Pat. No. 5,576,978).

However, all the interpolation functions used in these prior art methods are determined empirically and therefore represent approximations, a source of errors. Consequently, these prior art solutions are not sufficiently accurate.

SUMMARY OF THE INVENTION

The object of the present invention is to remedy these drawbacks. It concerns a method of determining, characteristics of a signal, in particular its frequency, accurately, at low cost, with high resolution, and without increasing the computation load, which method is suitable for any type of signal and regardless of the characteristic to be determined.

To this end the method in accordance with the invention of determining l characteristics Pq of a signal s(t,Pq) where q is an integer between 1 and l, l is an integer greater than or equal to 1 and t is time, the signal s(t,Pq) being transformed into a discrete spectrum by Fourier transformation, is remarkable in that:

a) m elements z(fi) of said discrete spectrum are selected where i is an integer between 1 and m and m is an integer greater than or equal to 2, b) a system of m equations is determined respectively relating to said m elements z(fi) selected and defined on the basis of the relations:

$$z(fi) = Fi[w(t).s(t,Pq)].h(f),$$

i varying from 1 through m, in which:

Fi is a discrete Fourier transform, w(t) is a temporal weighting function, and h(f) is a frequency transfer function of an anti-aliasing filter, and c) the l characteristics Pq are deduced from said system of m equations in l unknowns.

Accordingly, as the present invention is based, in so far as the calculations performed are concerned, not on an empirical approximation like the aforementioned prior art solutions, but on a rigorous mathematical solution, it increases the accuracy of the measurement of the characteristics Pq, which additionally necessitates only a few multiplications and additions, compared to the several hundred multiplications needed by a large Fourier transform, which therefore reduces the processing time.

The invention also reduces the calculation load and thus enables the use of a less powerful and less costly processor than the prior art solutions.

Although it improves the accuracy of the measurements of many characteristics, such as the amplitude or the phase of a signal, for example, the present invention is particularly suitable for the measurement of frequency, of which it improves the resolution and the accuracy.

Moreover, the method of the invention can easily be adapted to suit any type of processed signal, regardless of the characteristics to be examined, since in particular it is possible to use any type of temporal weighting function, for example a rectangular, triangular, Hamming or Blackman-Harris function.

Moreover, to improve the resolution, in accordance with the invention, a local maximum and that of the two elements adjacent to this local maximum whose modulus is greater are preferably selected to obtain the best signal/noise ratio.

The aforementioned processing can advantageously be simplified by carrying out the following operations:

when the numbers m and l are equal, the characteristics Pq that do not comprise the phase of the signal s(t,Pq) are determined from exact solutions of said system of m scalar equations based on the equality of the moduli, when the number m is greater than the number l the characteristics Pq that do not comprise the phase of the signal s(t,Pq) are determined by minimizing in said system of equations an error between the values of the various elements z(fi) respectively obtained from the discrete spectrum and calculated from the corresponding equations, when the number l is equal to the number 2m the characteristics Pq comprising the phase of the signal s(t,Pq) are determined from exact solutions of the 2m scalar equations obtained from the m complex equations z(fi), and when the number l is greater than the number 2m the characteristics Pq comprising the phase of the signal s(t,Pq) are determined by minimizing in said system of equations an error between the values of the various elements z(fi) respectively obtained from the discrete spectrum and calculated from the corresponding equations.

Moreover, when the signal is periodic, in a particularly advantageous first embodiment of the invention, the Fourier transform of said period signal s(t,Pq) is treated as a Dirac pulse localized at a frequency fo, of amplitude A and of phase $\phi$ and the parameters Pq are determined from the m equations:

$$z(fi)=Ae^{j\phi}w(fi-fo)$$

w(f) being the Fourier transform of the temporal weighting function w(t).

In this case, to determine only the frequency fo and the amplitude A of the signal s(t,Pq), it is preferable to select two elements z(fi) and z(fj) and to solve the following system of equations:

$$|z(fi)|=A|w(fi-fo)|$$

$$|z(fj)|=A|w(fj-fo)|$$

Moreover, to simplify the calculations, it is advantageous to determine the relation between the function r=z(fi)/z(fj) and the frequency numerically and to determine the frequency and the amplitude of the signal from this function.

Furthermore, in a second embodiment, for a periodic signal s(t,Pq) it is advantageous to treat the Fourier transform of said periodic signal s(t,Pq) as a pair of Dirac pulses localized at respective frequencies (+fo) and (−fo), of common amplitude A and of phase $\phi$ and to determine the parameters Pq from the m equations:

$$z(fi)=Ae^{j\phi}(w(fi-fo)+w(fi+fo)),$$

w(f) being the Fourier transform of the weighting coefficient w(t).

In this case, to determine only the frequency fo and the amplitude A of the signal s(t,Pq), it is preferable to select two elements z(fi) and z(fj) and to solve the following system of equations:

$$|z(fi)|=A|w(fi-fo)+w(fi+fo)|$$

$$|z(fj)|=A|w(fj-fo)+w(fj+fo)|$$

The present invention also concerns a device for implementing the aforementioned method.

In accordance with the invention, said device is remarkable in that it includes:

means for performing temporal weighting consisting in multiplying the signal s(t,Pq) by a temporal weighting function w(t), means for performing a Fourier transformation of the result of said temporal weighting, and means for deducing therefrom the l characteristics Pq, as well as:

means for low-pass filtering the signal s(t,Pq), means for sampling said signal, and means for finding the element from the spectrum having the highest modulus.

The present invention can be applied to a very large number of systems and in particular to any frequency measurement and determination system based on digital spectral analysis of a signal.

More particularly, the method of the invention can be used in a radioaltimetric measurement method to determine the frequency used to calculate the altitude, requiring no additional component.

Moreover, said method can be used in a laboratory spectrum analyzer including:

a pre-amplifier, a sampling device, an analogue/digital converter, a processor, and a graphic device for displaying the spectrum.

In this case, in accordance with the invention, a function is added to said processor to determine by the aforementioned method particular characteristics of the signal, such as the effective amplitude and the effective frequency of a local maximum in the spectrum. Also, these characteristics can be numerically displayed by the display device, for example.

Accordingly, using the invention on an analyzer of the above kind does not require any additional hardware compared to a standard analyzer architecture and is therefore of low cost.

BRIEF DESCRIPTION OF THE DRAWINGS

The figures of the accompanying drawings explain how the invention can be put into effect. In these figures, the same references designates similar items

DETAILED DESCRIPTION OF THE PREFERRED EMBODIMENTS

Figure 1:
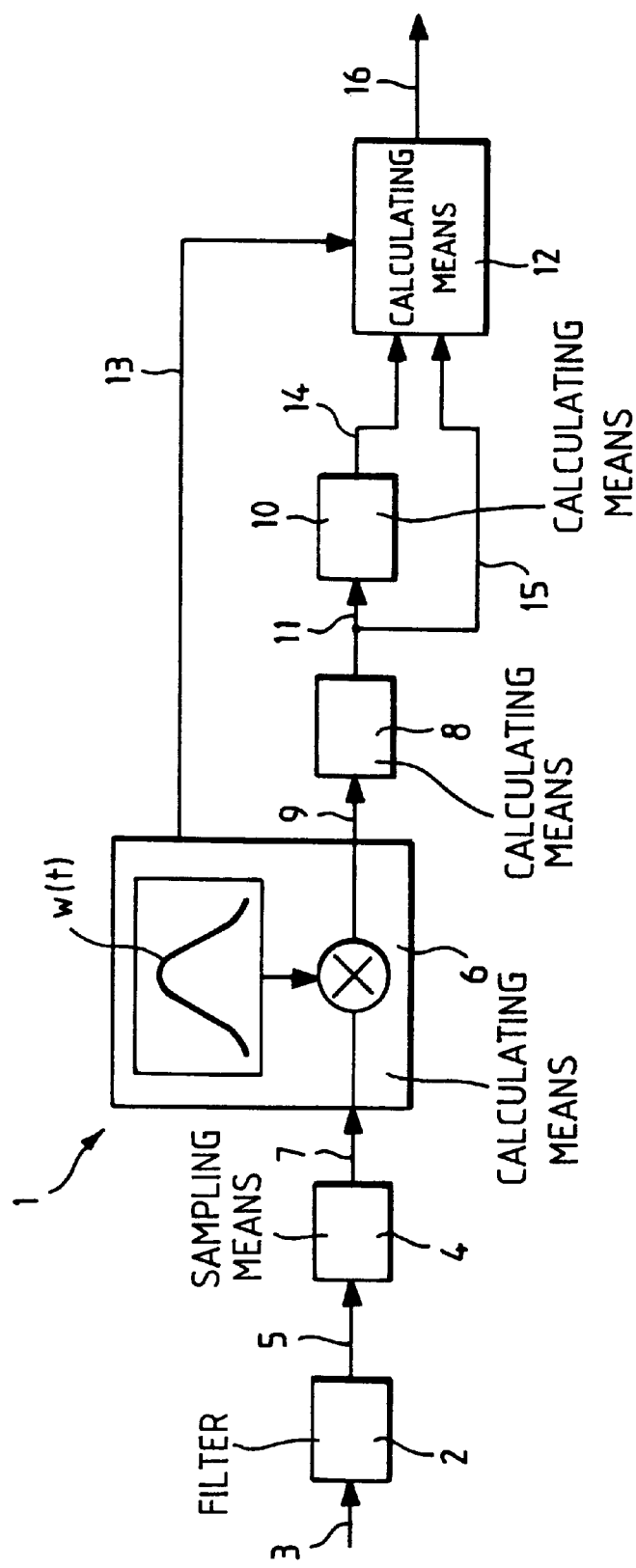
FIG. 1 is block schematic of a device in accordance with the invention.

The device 1 in accordance with the invention and represented schematically in FIG. 1 is adapted to determine characteristics Pq specified below of a temporal signal s(t,Pq) where t represents time.

To this end, said device 1 includes:

filter means 2 receiving the signal s(t,Pq) to be processed over a connection 3 to apply low-pass filtering to eliminate the frequency components higher than half the sampling frequency fe and to avoid aliasing, means 4 connected by a connection 5 to the filter means 2 and including components for sampling at the frequency fe, analogue/digital conversion and memorizing the result. A sample si of rank i then corresponds to a time ti=i.T/n where T is the width of the temporal window containing n samples, the time origin being chosen at the first sample, calculating means 6 connected to the memory unit of the means 4 by a connection 7 to perform the temporal weighting specified below, calculating means 8 connected to the calculating means 6 by a connection 9 to carry out a type of Fourier transformation known in itself, calculating means 10 connected to the calculating means 8 by a connection 11 to look for the wanted signal in the spectrum produced by the calculating means 8. As explained below, said calculating means 10 are adapted, in accordance with the invention, to search for the sample having the maximum modulus, at least a local maximum, and calculating means 12 connected to the calculating means 6, 10 and 8 by respective connections 13, 14 and 15 to perform an interpolation process in accordance with the invention specified below.

Figure 2:
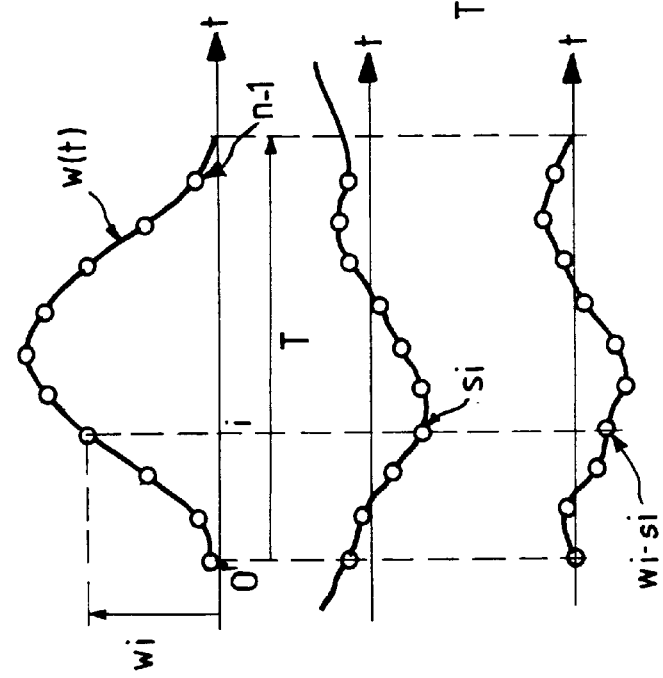
FIG. 2 illustrates the temporal weighting employed by the invention.

In the known manner, the temporal weighting applied by the calculating means 6 consists in multiplying the successive samples by a temporal weighting function w(t), as represented by way of example as a function of time t in the upper diagram in FIG. 2, which also indicates a value of wi for a rank i. If the n samples si from the memory unit of the means 4 and represented in the middle diagram in FIG. 2 are taken into account, the processing performed by the calculating means 6 obtains, for each rank i, the corresponding value. wi.si represented in the lower diagram in FIG. 2. The present invention can be applied to any type of weighting function chosen to obtain the best possible result in accordance with the intended processing.

In accordance with the invention, to determine 1 characteristics Pq of the signal s(t,Pq), where q is an integer between 1 and l and l is an integer greater than or equal to 1 the calculating means 12 perform the following operations on the basis of the discrete spectrum formed by the calculating means 8:

a) they select m elements z(fi) of said discrete spectrum where i is an integer between 1 and n and m is an integer greater than or equal to 2, and b) they determine the l characteristics Pq from a system of m equations respectively relating to said m elements z(fi) selected and defined by the relations:

$$z(fi)=Fi[w(t).s(t,Pq)].h(f), \qquad (1)$$

i varying from 1 through m, in which:

Fi is a discrete Fourier transform, w(t) is the chosen temporal weighting function, and h(f) is a frequency transfer function of an anti-aliasing filter.

Assume therefore that the input signal s(t,Pq) can be expressed with a finite number l of parameters Pq assumed to be constant during time interval T.

For example, for a sinusoidal signal in the form $s(t)=A\cos(2\pi fot+\phi)$ said parameters are the frequency fo, the amplitude A and the phase $\phi$.

The interpolation performed by the calculating means 12 therefore consists in evaluating the parameters Pq for which the calculated values are closest to the measured values for all of the elements z(fi)

The present invention proposes four variants of this evaluation, depending on whether the phase of the signal is required or not and according to the number m of elements as a function of the number l of characteristics.

If the phase is not required, the characteristics Pq are determined from the system of equations resulting from the equality of the m moduli:

$$|z(fi)|=|Fi[w(t).s(t,Pq)].h(f)|$$

In this case:

when the number m of elements or samples z(fi) in the spectrum is equal to the number l, the preceding expression yields a system of m scalar equations and the characteristics Pq are then the exact solutions of this system of scalar equations, and when the number m is greater than the number l of characteristics Pq the latter are determined by minimizing in said system of equations an error between the values of the various elements z(fi) respectively obtained from the discrete spectrum and calculated from the corresponding equations. This error is a quadratic error, for example (least squares method).

On the other hand, if the phase is also to be identified, the aforementioned system of equations (1) comprises m complex equations, i.e. 2m scalar equations.

In this case:

when the number 2m is equal to the number l the characteristics Pq are determined from exact solutions of these 2m scalar equations, and when the number 2m is greater than the number 1 the characteristics Pq are determined by minimizing in said system of equations an error, for example a quadratic error, between the values of the various elements z(fi) respectively obtained from the discrete spectrum and calculated from the corresponding equations.

Note that in most intended applications justified simplifying hypotheses yield extremely simple calculations. In particular, the effect of the anti-aliasing filter can generally be ignored and it can be assumed that the frequency transfer function h(f) is equal to unity.

Moreover, when the signal s(t,Pq) is a periodic signal, its Fourier transform is a set of Dirac pulses localized at the fundamental and harmonic frequencies. The effect of temporal weighting is to spread each of these Dirac pulses in the form of a signal having a more or less "flat" maximum and larger or smaller secondary lobes, depending on the temporal weighting function used. If the fundamental frequency of the signal is also relatively far from zero the interference between the spread Dirac pulses can be neglected.

Accordingly, for elements near the positive fundamental (+fo), the mathematical expressions for $z(fi)$ become very simple:

$$z(fi) = A e^{j\phi} w(fi - fo), \quad (5)$$

$w(f)$ being the Fourier transform of the temporal weighting coefficient $w(t)$.

In this case, to determine only the frequency fo and the amplitude A of the signal $s(t, Pq)$, two elements $z(fi)$ and $z(fj)$ are selected and the following system of equations is solved:

$$|z(fi)| = A|w(fi - fo)|$$

$$|z(fj)| = A|w(fj - fo)|$$

Otherwise, the Fourier transform of said periodic signal $s(t, Pq)$ can be treated as a pair of Dirac pulses localized at respective frequencies (+fo) and (−fo), of common amplitude A and of phase $\phi$ and the parameters Pq are determined from the m equations:

$$z(fi) = A e^{j\phi}(w(fi - fo) + w(fi + fo)).$$

In this case, if only the frequency fo and the amplitude A of the signal $s(t, Pq)$ are to be determined, two elements $z(fi)$ and $z(fj)$ are selected and the following system of equations is solved:

$$|z(fi)| = A|w(fi - fo) + w(fi + fo)|$$

$$|z(fj)| = A|w(fj - fo) + w(fi + fo)|$$

In accordance with the invention, the two elements $z(fi)$ and $z(fj)$ selected by the calculating means 10 are preferably a local maximum and that of the two elements adjacent this local maximum having the higher modulus. This choice in the selection process yields the best possible signal/noise ratio, increasing the accuracy of the processing.

Various embodiments of the invention are described hereinafter, in particular according to the signal $s(t, Pq)$ to be processed. Of course these embodiments are described by way of example only, and are not in any way limiting on the invention.

In a first example, the aim is to determine the amplitude A and the frequency fo of a signal $s(t)$ in the form:

$$s(t) = 2A \cos(2\pi f o t).$$

Its Fourier transform is:

$$s(f) = A(\delta(f + fo) + \delta(f - fo)) \quad (2)$$

where $\delta(f)$ is the unit amplitude pulse (or the Dirac signal) centered on the zero point.

In a first implementation the temporal weighting function used is the rectangular window defined by:

$$w(t) = 1 \text{ for } t \text{ inside the range } [-T/2 \, T/2]$$

$$w(t) = 0 \text{ for } t \text{ outside the range } [-T/2 \, T/2]$$

In the known manner, its Fourier transform is:

$$w(f) = \frac{\sin(\pi f T)}{\pi f T} \quad (3)$$

The spectrum $z(f)$ obtained after temporal weighting and Fourier transformation is the product of convolution of equations (2) and (3):

$$z(f) = A\left(\frac{\sin(\pi(f - fo)T)}{\pi(f - fo)T} + \frac{\sin(\pi(f + fo)T)}{\pi(f + fo)T}\right) \quad (4)$$

At this stage it is possible to distinguish two situations:

the situation in which the frequency of the signal is far from zero, and the situation in which the frequency of the signal is near zero.

In the former case, the influence of the negative component is ignored. Equation (4) is then written:

$$z(f) = A \frac{\sin(\pi(f - fo)T)}{\pi(f - fo)T}$$

which for a discrete spectrum becomes:

$$z(fi) = A \frac{\sin(\pi(i - ko))}{\pi(i - ko)}$$

where ko is the reduced frequency:

$$ko = nfo/fe$$

Considering Ai and Aj, the moduli of the two elements sampled from the spectrum by the calculating means 10 in accordance with the invention, the amplitude A and the reduced frequency ko are calculated by solving the following system of equations:

$$Ai = A \cdot \frac{\sin(\pi(i - ko))}{\pi(i - ko)}$$

$$Aj = A \cdot \frac{\sin(\pi(j - ko))}{\pi(j - ko)}$$

As previously indicated, to maximize the signal/noise ratio, two elements Ai and Aj are a local maximum and that of the adjacent elements having the greater amplitude. Because in this case $j = i+1$ and by introducing the ratio $r = Ai/Ai+1$ the solution is obtained:

$$\begin{cases} ko = i + \dfrac{1}{1 + r} \\ A = Ai \dfrac{\pi(i - ko)}{\sin(\pi(i - ko))} \end{cases}$$

On the other hand, in the second case where it is assumed that the frequency of the signal is close to zero, the interaction between the negative and positive components of the signal is no longer negligible and it is therefore necessary to allow for the two components so that the amplitude and the frequency identified are not degraded.

The discrete spectrum equation obtained from equation (4) is then written:

$$z(fi) = A\left(\frac{\sin(\pi(i - ko))}{\pi(i - ko)} + \frac{\sin(\pi(i + ko))}{\pi(i + ko)}\right)$$

Developing as previously, the solution finally obtained is:

$$\begin{cases} ko = \sqrt{i^2 + \dfrac{2i+1}{1+r}} \\ A = \dfrac{Ai}{\dfrac{\sin(\pi(i-ko))}{\pi(i-ko)} + \dfrac{\sin(\pi(i+ko))}{\pi(i+ko)}} \end{cases}$$

In a second embodiment relating to the first example, in which, instead of a rectangular weighting function, the Hamming function is used, which is written:

$$w(t) = \frac{1 + \cos(2\pi t/T)}{2}$$

the following developments are performed.

The Fourier transform of w(t) is, in the manner known in itself:

$$w(f) = \frac{\sin(\pi fT)}{\pi fT}\left(1 + \frac{f^2 T^2}{2(1-f^2 T^2)}\right)$$

Ignoring the influence of the negative component, the discrete spectrum interpolation function is written:

$$z(fi) = A \cdot \frac{\sin(\pi \delta k)}{\pi \delta k}\left(1 + \frac{\delta k^2}{2(1-\delta k^2)}\right)$$

Selecting two elements in the spectrum, as previously indicated, the ratio of the moduli r=Ai/Ai+1 obtained is:

$$r = \frac{-\delta k^3 + \delta k^2 + 3\delta k + 1}{\delta k^3 - 2\delta k^2 - 2\delta k + 4} \quad (5)$$

This equation (5) is of the third degree in δk and can be solved analytically, by the Cardan method, for example.

However, in another solution in accordance with the invention, the function δk(r) can be tabulated. The required value can then be deduced directly from this table. This latter solution minimizes the calculation load.

A second embodiment of the invention is described below in which the frequencies f1 and f2, the amplitudes 2A1 and 2A2 and the phases φ1 and φ2 of two sinusoidal signals are determined using a rectangular weighting function.

Consequently, the temporal signal considered is of the form:

$$s(t) = 2A1 \cos(2\pi f1 t + \phi 1) + 2A2 \cos(2\pi f2 t + \phi 2)$$

Ignoring interference between the negative and positive parts of the spectrum, the interpolation function is written:

$$z(fi) = A1 e^{j\phi 1}\frac{\sin(\pi \delta k1)}{\pi \delta k1} + A2 e^{j\phi 2}\frac{\sin(\pi \delta k2)}{\pi \delta k2}$$

where $$\delta k1 = i - k1 \text{ and } \delta k2 = i - k2$$

where δk1=i−k1 and δk2=i−k2

Selecting three complex elements z(fi) from the spectrum, a system of three complex expressions can be constructed, i.e. a system of six scalar equations, solving which identifies the parameters Pq (A1, A2, f1, f2, φ1, φ2) of said signal s(t).

This solution is preferably used to discriminate two signals of very close frequencies, for example in a Doppler radar, the wanted signal and a spurious signal due to direct transmit-receive coupling (with no echo from the target).

As previously indicated, the above embodiments are not limiting on the invention and are only of interest as illustrations of the wide uses and applications of the device and the method of the invention.

Because of these characteristics, said device and said method in accordance with the invention can be applied to a very large number of systems, and in particular to a laboratory spectrum analyzer, as previously indicated.

Figure 3:
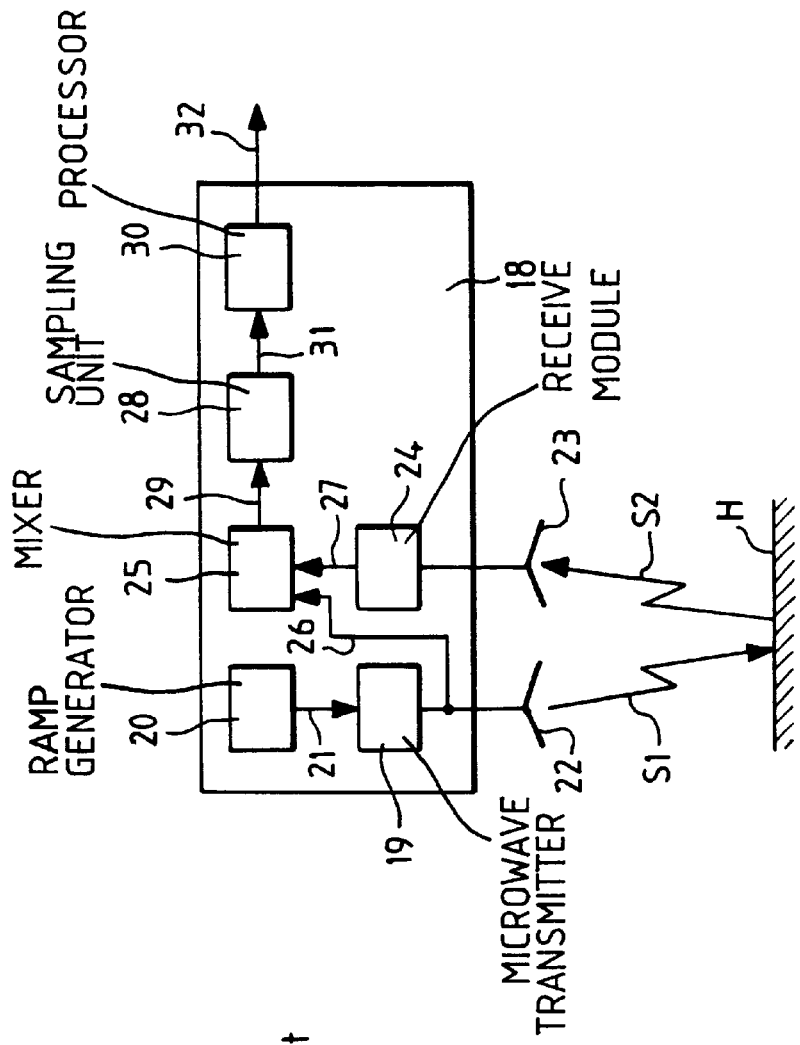
FIG. 3 is a schematic illustration of a is radioaltimeter to which the present invention is applied.

By way of illustration, there is described hereinafter a single application of the present invention to a radioaltimeter 18 shown in FIG. 3.

A radioaltimeter 18 of this kind includes, in a manner known in itself:

- a microwave transmitter module 19 connected to a ramp generator 20 by a connection 21 to control the frequency of said microwave transmitter module 19,
- a transmit antenna 22 connected to said microwave transmitter module 19,
- a receive antenna 23,
- a receive module 24 connected to said receive antenna 23,
- a mixer 25 connected by respective connections 26, 27 to said microwave transmitter module 19 and to said receiver module 24,
- a sampling and analogue/digital conversion unit 28 connected by a connection 29 to said mixer 25, and
- a processor 30 connected by a connection 31 to said unit 28 for processing the received signal to determine the altitude, which can be transmitted to a user device, not shown, over a connection 32.

Said radioaltimeter 18 performs the following operations, in a manner known in itself:

- the antenna 22 transmits a radio signal S1 towards the ground,
- the antenna 23 detects a reflected signal S2 corresponding to the reflection by the ground H of said transmitted signal S1,
- the mixer 25 forms a beat signal by mixing said transmitted and detected signals S1 and S2,
- the unit 28 samples and digitizes said beat signal, and
- the processor 30 performs the Fourier transformation of said sampled and digitized beat signal and determines the frequency of the maximum in the Fourier transform, this frequency being used directly to calculate the altitude.

The result obtained is known to be subject to a quantizing error.

To eliminate this quantizing error, in accordance with the invention, the processor 30 calculates said frequency using the aforementioned method of the invention.

This yields an exact value for said frequency and therefore also for the required height.

What is claimed is:

1. A method of determining 1 characteristics Pq of a signal s(t, Pq) where q is an integer between 1 and l, l is an integer greater than or equal to 1 and t is time, said signal s(t, Pq) being transformed into a discrete spectrum by Fourier transformation, wherein:

a) m elements z(fi) of said discrete spectrum are selected where i is an integer between 1 and m and m is an integer greater than or equal to 2, b) a system of m equations is determined respectively relating to said m elements z (fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(t) is a frequency transfer function of an anti-aliasing filter, and c) the l characteristics Pq are deduced from said system of m equations in l unknowns,
wherein when the numbers m and l are equal, the characteristics Pq that do not comprise the phase of the signal s(t, Pq) are determined from exact solutions of said system of m scalar equations based on the equality of the moduli.

2. A method according to claim 1 wherein said transfer function h(f) is equal to unity.

3. A radioaltimetric measuring method comprising:
transmitting a modulated radio signal (Sl) towards ground (H);
detecting a reflected signal (S2) corresponding to a reflection by ground (H) of said signal S(1);
forming a beat signal by mixing said signals (S1, S2);
sampling and digitizing said beat signal to form a sampled and digitized beat signal;
calculating a Fourier transform of said sampled and digitized beat signal;
determining a frequency of a maximum of said Fourier transform by using the method according to claim 1; and
calculating an altitude from said frequency.

4. A spectrum analyzer comprising:
a pre-amplifier;
a sampling device;
an analogue/digital converter;
a processor; and
a graphic device for displaying a spectrum,
wherein said processor is adapted to determine characteristics Pq of signal s(t, Pq) to be analyzed by the method according to claim 1.

5. A method of determining l characteristics Pq of a signal s(t, Pq) where q is an integer between 1 and l, l is an integer greater than or equal to 1 and t is time, said signal s(t, Pq) being transformed into a discrete spectrum by Fourier transformation, wherein:
a) m elements z(fi) of said discrete spectrum are selected where i is an integer between 1 and m and m is an integer greater than or equal to 2,
b) a system of m equations is determined respectively relating to said m elements z(fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(f) is a frequency transfer function of an anti-aliasing filter, and c) the l characteristics Pq are deduced from said system of m equations in l unknowns,
wherein when the number m is greater than the number l, the characteristics Pq that do not comprise the phase of the signal s(t, Pq) are determined by minimizing in said system of equations an error between the values of the various elements z(fi) respectively obtained from the discrete spectrum and calculated from the corresponding equations.

6. A method according to claim 5 wherein said transfer function h(f) is equal to unity.

7. A radioaltimetric measuring method comprising:
transmitting a modulated radio signal (S1) towards ground (H);
detecting a reflected signal (S2) corresponding to a reflection by ground (H) of said signal S(1);
forming a beat signal by mixing said signals (S1, S2);
sampling and digitizing said beat signal to form a sampled and digitized beat signal;
calculating a Fourier transform of said sampled and digitized beat signal;
determining a frequency of a maximum of said Fourier transform by using the method according to claim 5; and
calculating an altitude from said frequency.

8. A spectrum analyzer comprising:
a pre-amplifier;
a sampling device;
an analogue/digital converter;
a processor; and
a graphic device for displaying a spectrum,
wherein said processor is adapted to determine characteristics Pq of signal s(t, Pq) to be analyzed by the method according to claim 5.

9. A method of determining l characteristics Pq of a signal s(t, Pq) where q is an integer between 1 and l, l is an integer greater than or equal to 1 and t is time, said signal s(t, Pq) being transformed into a discrete spectrum by Fourier transformation, wherein:
a) m elements z(fi) of said discrete spectrum are selected where i is an integer between 1 and m and m is an integer greater than or equal to 2,
b) a system of m equations is determined respectively relating to said m elements z (fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(f) is a frequency transfer function of an anti-aliasing filter, and c) the l characteristics Pq are deduced from said system of m equations in l unknowns,
wherein when the number l is equal to the number 2m, the characteristics Pq comprising the phase of the signal s(t, Pq) are determined from exact solutions of the 2m scalar equations obtained from the m complex equations z(fi).

10. A method according to claim 9 wherein said transfer function h(f) is equal to unity.

11. A radioaltimetric measuring method comprising:
transmitting a modulated radio signal (S1) towards ground (H);
detecting a reflected signal (S2) corresponding to a reflection by ground (H) of said signal S(1);
forming a beat signal by mixing said signals (S1, S2);

sampling and digitizing said beat signal to form a sampled and digitized beat signal;

calculating a Fourier transform of said sampled and digitized beat signal;

determining a frequency of a maximum of said Fourier transform by using the method according to claim 9; and calculating an altitude from said frequency.

12. A spectrum analyzer comprising:
a pre-amplifier;
a sampling device;
an analogue/digital converter;
a processor; and
a graphic device for displaying a spectrum,
wherein said processor is adapted to determine characteristics Pq of signal s(t, Pq) to be analyzed by the method according to claim 9.

13. A method of determining 1 characteristics Pq of a signal s(t, Pq) where q is an integer between 1 and l, l is an integer greater than or equal to 1 and t is time, said signal s(t, Pq) being transformed into a discrete spectrum by Fourier transformation, wherein:

a) m elements z(fi) of said discrete spectrum are selected where i is an integer between 1 and m and m is an integer greater than or equal to 2, b) a system of m equations is determined respectively relating to said m elements z (fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(f) is a frequency transfer function of an anti-aliasing filter, and c) the 1 characteristics Pq are deduced from said system of m equations in l unknowns,
wherein when the number l is less than the number 2m, the characteristics Pq comprising the phase of the signal s(t, Pq) are determined by minimizing in said system of equations an error between the values of the various elements z(fi) respectively obtained from the discrete spectrum and calculated from the corresponding equations.

14. A method according to claim 13 wherein said transfer function h(f) is equal to unity.

15. A radioaltimetric measuring method comprising:
transmitting a modulated radio signal (S1) towards ground (H);
detecting a reflected signal (S2) corresponding to a reflection by ground (H) of said signal S(1);
forming a beat signal by mixing said signals (S1, S2);
sampling and digitizing said beat signal to form a sampled and digitized beat signal;
calculating a Fourier transform of said sampled and digitized beat signal;
determining a frequency of a maximum of said Fourier transform by using the method according to claim 13; and
calculating an altitude from said frequency.

16. A spectrum analyzer comprising:
a pre-amplifier;
a sampling device;
an analogue/digital converter;
a processor; and
a graphic device for displaying a spectrum,
wherein said processor is adapted to determine characteristics Pq of signal s(t, Pq) to be analyzed by the method according to claim 13.

17. A method of determining 1 characteristics Pq of a signal s(t, Pq) where q is an integer between 1 and l, l is an integer greater than or equal to 1 and t is time, said signal s(t, Pq) being transformed into a discrete spectrum by Fourier transformation, wherein:

a) m elements z(fi) of said discrete spectrum are selected where i is an integer between 1 and m and m is an integer greater than or equal to 2, b) a system of m equations is determined respectively relating to said m elements z (fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(f) is a frequency transfer function of an anti-aliasing filter, and c) the l characteristics Pq are deduced from said system of m equations in l unknowns,
wherein for a periodic signal s(t, Pq), the Fourier transform of said periodic signal s(t, Pq) is treated as a Dirac pulse localized at a frequency fo, of amplitude A and of phase φ and the parameters Pq are determined from the m equations:

$$z(fi)=Ae^{j\phi}w(fi-fo),$$

i varying from 1 through m and w(t) being the Fourier transform of the temporal weighting function w(t).

18. A method according to claim 17 additionally comprising:
determining said frequency fo and said amplitude A of said signal s(t, Pq) by selecting two elements z(fi) and z(fj) and solving the following system of equations:

$$|z(fi)|=A|w(fi-fo)|$$
$$|z(fj)|=A|w(fj-fo)|.$$

19. A method according to claim 18 additionally comprising:
selecting a local maximum and that of said two elements z(fi) and z(fj) adjacent said local maximum having the higher modulus.

20. A method according to claim 19 additionally comprising:
numerically determining a relation between the function r=z(fi)/z(fj) and said frequency; and
determining a frequency and an amplitude of said signal from said function.

21. A radioaltimetric measuring method comprising:
transmitting a modulated radio signal (S1) towards ground (H);
detecting a reflected signal (S2) corresponding to a reflection by ground (H) of said signal S(1);
forming a beat signal by mixing said signals (S1, S2);
sampling and digitizing said beat signal to form a sampled and digitized beat signal;

calculating a Fourier transform of said sampled and digitized beat signal;

determining a frequency of a maximum of said Fourier transform by using the method according to claim 17; and calculating an altitude from said frequency.

22. A spectrum analyzer comprising:

a pre-amplifier;

a sampling device;

an analogue/digital converter;

a processor; and a graphic device for displaying a spectrum, wherein said processor is adapted to determine characteristics Pq of signal s(t, Pq) to be analyzed by the method according to claim 17.

23. A method of determining l characteristics Pq of a signal s(t,Pq) where q is an integer between 1 and l, l is an integer greater than or equal to 1 and t is time, said signal s(t, Pq) being transformed into a discrete spectrum by Fourier transformation, wherein:

a) m elements z(fi) of said discrete spectrum are selected where i is an integer between 1 and m and m is an integer greater than or equal to 2, b) a system of m equations is determined respectively relating to said m elements z (fi) selected and defined on the basis of the relations:

$$z(fi)=Fi[w(t).s(t, Pq)].h(f),$$

i varying from 1 through m, in which:
Fi is discrete Fourier transform,
w(t) is a temporal weighting function, and
h(f) is a frequency transfer function of an anti-aliasing filter, and c) the l characteristics Pq are deduced from said system of m equations in l unknowns, wherein for a periodic signal s(t, Pq), the Fourier transform of said periodic signal s(t, Pq) is treated as a pair of Dirac pulses localized at respective frequencies (+fo) and (−fo), of common amplitude A and of phase φ and the parameters Pq are determined from the m equations:

$$z(fi)=Ae^{j\phi}(w(fi-fo)+w(fi+fo)),$$

i varying from 1 through m and w(f) being the Fourier transform of the weighting coefficient w(t).

24. A method according to claim 23 additionally comprising:

determining said frequency fo and said amplitude A of said signal s(t, Pq) by selecting two elements z(fi) and z(fj) and solving the following system of equations:

$$|z(fi)|=A|w(fi-fo)+w(fi+fo)|$$

$$|z(fj)|=A|w(fj-fo)+w(fj+fo)|.$$

25. A method according to claim 24 additionally comprising:

selecting a local maximum and that of said two elements z(fi) and z(fj) adjacent said local maximum having the higher modulus.

26. A method according to claim 25 additionally comprising:

numerically determining a relation between the function r=z(fi)/z(fj) and said frequency; and determining a frequency and an amplitude of said signal from said function.

27. A radioaltimetric measuring method comprising:

transmitting a modulated radio signal (S1) towards ground (H);

detecting a reflected signal (S2) corresponding to a reflection by ground (H) of said signal S(1);

forming a beat signal by mixing said signals (S1, S2);

sampling and digitizing said beat signal to form a sampled and digitized beat signal;

calculating a Fourier transform of said sampled and digitized beat signal;

determining a frequency of a maximum of said Fourier transform by using the method according to claim 23; and calculating an altitude from said frequency.

28. A spectrum analyzer comprising:

a pre-amplifier;

a sampling device;

an analogue/digital converter;

a processor; and a graphic device for displaying a spectrum, wherein said processor is adapted to determine characteristics Pq of signal s(t, Pq) to be analyzed by the method according to claim 23.

* * * * *